United States Patent
Opsahl

(10) Patent No.: US 8,125,277 B1
(45) Date of Patent: Feb. 28, 2012

(54) DUAL LOOP FREQUENCY SYNTHESIZER

(75) Inventor: Paul L. Opsahl, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 84 days.

(21) Appl. No.: 12/573,011

(22) Filed: Oct. 2, 2009

(51) Int. Cl.
*H03L 7/00* (2006.01)
(52) U.S. Cl. ......... 331/1 A; 331/16; 331/34; 331/177 R; 327/156; 327/159
(58) Field of Classification Search .......... 331/1 A, 331/16, 34, 177 R; 327/156, 159
See application file for complete search history.

(56) References Cited

U.S. PATENT DOCUMENTS

| | | | |
|---|---|---|---|
| 5,015,971 A | 5/1991 | Taylor et al. | |
| 6,356,597 B1 | 3/2002 | Jackson et al. | |
| 7,098,754 B2 * | 8/2006 | Humphreys et al. | 332/103 |
| 7,508,275 B1 * | 3/2009 | Paniccia | 331/16 |
| 2002/0153959 A1 * | 10/2002 | Gotz et al. | 331/1 A |

* cited by examiner

*Primary Examiner* — Arnold Kinkead
(74) *Attorney, Agent, or Firm* — Donna P. Suchy; Daniel M. Barbieri

(57) ABSTRACT

A frequency synthesizer has a fractional $N_1$ loop and an integer $N_2$ loop. The output frequency of the signal of the fractional $N_1$ loop is constrained to values between adjacent harmonics of a reference frequency used in the fractional $N_1$ loop. The signal of the fractional $N_1$ loop is received by the integer $N_2$ loop. The integer $N_2$ loop provides an output signal. The output signal can be a high frequency signal such as 2-8 GHz signal.

20 Claims, 2 Drawing Sheets

US 8,125,277 B1

DUAL LOOP FREQUENCY SYNTHESIZER

BACKGROUND OF THE INVENTION

The present specification relates generally to the field of signal generation for electronic devices. More particularly, the present specification relates to a frequency synthesizer.

U.S. Pat. No. 7,508,275, assigned to assignee of the present application, discusses frequency synthesizers as well as other electronic components. In general, fractional-N synthesizers can be utilized to provide one or more signals at a number of different frequencies. Generally, such systems utilize a phase locked loop (PLL) that includes a voltage controlled oscillator (VCO), a filter, a crystal oscillator, a fractional divider and a phase frequency detector. However, fractional-N synthesizers can be prone to providing spurious side band signals. An integer boundary spur or fractional spur can be caused by the carrier frequency of the PLL crossing over harmonics of the phase frequency detector sampling frequency. Spurious side band signals can degrade the performance of the device within which the frequency synthesizer is utilized. This performance degradation can be particularly problematic in wide bandwidth synthesizer applications.

Accordingly, there is a need for a frequency synthesizer that provides adaptable tuning and yet has reduced problems associated with spurious sidebands. Yet further, there is a need for a frequency synthesizer architecture that provides a high resolution, wide band frequency signals and avoids spurious signals. Yet further still, there is a need for a frequency synthesizer architecture that yields a highly integrated synthesizer that reduces size, weight, power, and complexity.

SUMMARY OF THE INVENTION

An exemplary embodiment relates to a frequency synthesizer. The frequency synthesizer provides a first output signal in the 2-8 GHz range. The frequency synthesizer includes a fractional loop and an integer loop. The fractional loop has a first output for providing a second output signal. The fractional loop includes a fractional divider. The fractional divider has a fractional divider input coupled to the first output and a fractional divider output coupled to a first input of a first phase frequency detector. A second input of the phase frequency detector is coupled to a reference signal. The reference signal has a frequency of less than 40 MHz. The integer loop has a first input coupled to receive the second output signal and a second output for providing the first output signal. The integer loop includes a first integer divider. The first integer divider has a first integer divider input coupled to receive the second output signal and a first integer divider output coupled to a first input of a second phase frequency detector. A second input of the second phase frequency detector is coupled to receive a second integer divider output from a second integer divider. A first input of a second integer divider is coupled to receive the first output signal.

Another exemplary embodiment relates to an electronic device. The electronic device includes a frequency synthesizer having a fractional loop and an integer loop. The output frequency of the signal of the fractional loop is constrained to a range of values between adjacent harmonics of a reference frequency used in the fractional loop. The signal of the fractional loop is received by the integer loop.

Another exemplary embodiment relates to a method of providing an output signal. The method comprises providing a first signal from a first oscillator at a first frequency to a fractional divider and providing a first divided signal from the fractional divider to a phase or frequency detector. The method also includes providing a reference frequency signal to the detector, and providing a control signal from the detector to the first oscillator. A frequency of the first signal is chosen to be in a range between adjacent harmonics of the referenced frequency signal. The method also concludes providing the first signal to an integer divider phase locked loop.

BRIEF DESCRIPTION OF THE DRAWINGS

Exemplary embodiments will become more fully understood from the following detail description taken in conjunction with the accompanying drawings, wherein like numerals refer to like parts, and wherein.

DETAILED DESCRIPTION OF THE PREFERRED EMBODIMENTS

Figure 1:
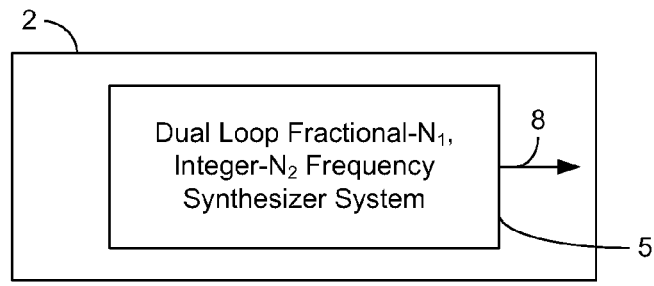
FIG. 1 is a general block diagram of an electronic device including a frequency synthesizer in accordance with an exemplary embodiment.

Before describing in detail the particular improved system and method, it should be observed that the invention includes, but is not limited to a novel structural combination of conventional data/signal processing components and circuits, and not in the particular detailed configurations thereof. Accordingly, the structure, methods, functions, control and arrangement of conventional components and circuits have, for the most part, been illustrated in the drawings by readily understandable block representations and schematic diagrams, in order not to obscure the disclosure with structural details which will be readily apparent to those skilled in the art, having the benefit of the description herein. Further, the invention is not limited to the particular embodiments depicted in the exemplary diagrams, but should be construed in accordance with the language in the claims.

With reference to FIG. 1, an electronic device 2 includes a frequency synthesizer system 5. Frequency synthesizer system 5 is preferably a dual loop frequency synthesizer configured to reduce spurious side bands associated with a high frequency signal capable of being provided at variable frequencies. In one embodiment, system 5 can be configured as a fractional-N1, integer-N2 frequency synthesizer (e.g., a Dual-FIN Synthesizer). Preferably, electronic device 2 can be any electronic device that utilizes a signal generated by a frequency synthesizer. For example, system 5 can be a radio, a radar system, a computer system, a communication system, an optical system, etc. In addition, electronic device 2 can be part of a larger electronic device such as part of a component in a radio system such as a modulator, demodulator, decoder, clock circuit, synchronizer or any circuit that requires a variable frequency signal, etc.

Synthesizer system 5 preferably provides an output signal at an output 8. The output signal at output 8 is preferably a high frequency signal such as a 2-8 gigahertz (GHz) signal capable of being provided at a number of different frequencies. Preferably, system 5 is configured so that the signal at output 8 can be advantageously provided across a wide band and yet is not susceptible to spurious side bands. Synthesizer system 5 is preferably configured so that spurious side bands associated with integer boundary spurs are reduced. Spurs can be caused by the carrier frequency of phase locked loops (PLLs) crossing over harmonics of the phase detector sampling frequency.

Figure 2:
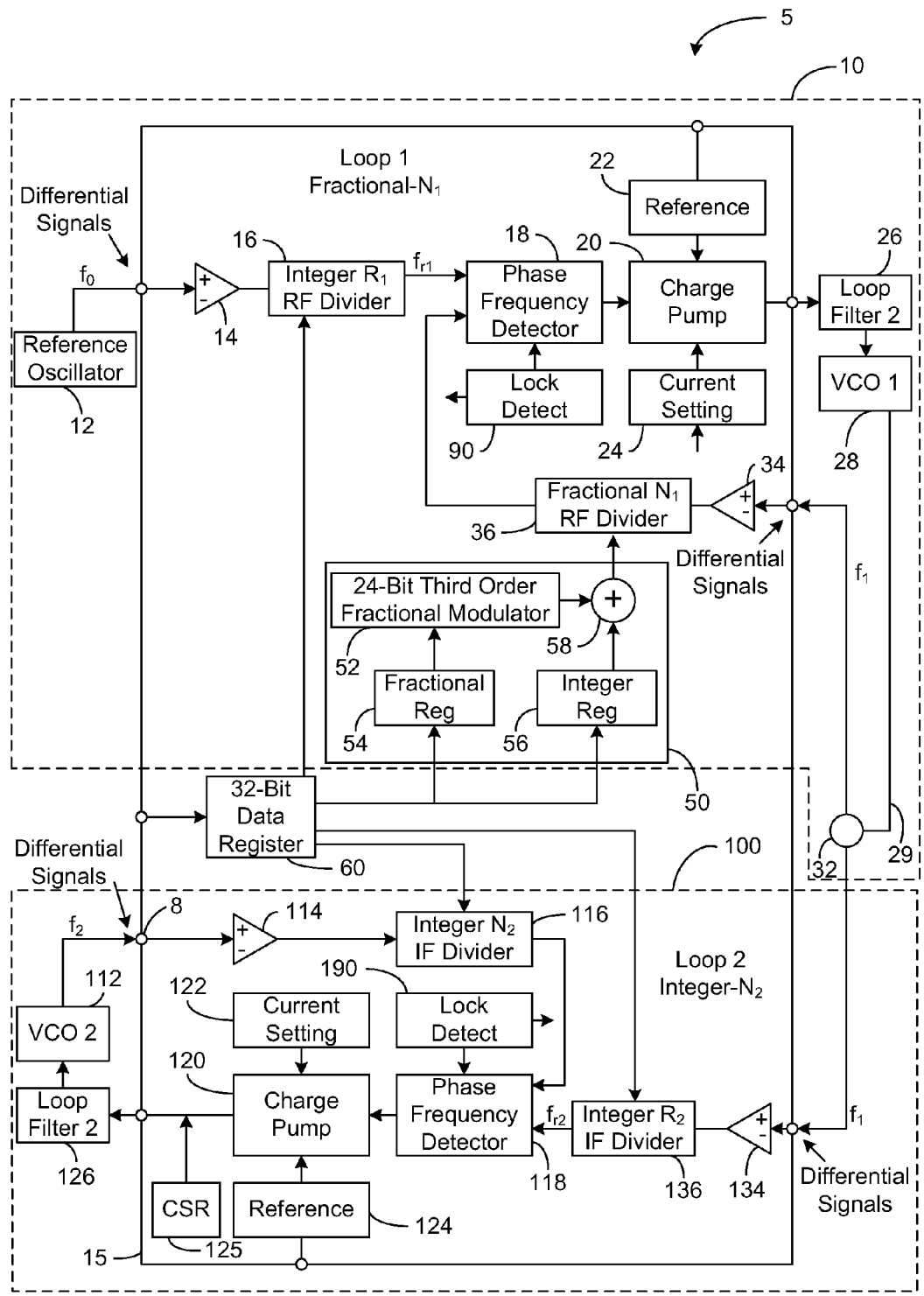
FIG. 2 is a more detailed block diagram of the frequency synthesizer illustrated in FIG. 1, in accordance with another exemplary embodiment.

With reference to FIG. 2, fractional-N1, integer-N2 frequency synthesizer system 5 preferably includes a fractional N1 loop 10 and an integer N2 loop 100. Loops 10 and 100 can be provided on a common integrated circuit such as integrated circuit 15. In a preferred embodiment, integrated circuit 15 is an ASIC device configured to provide the circuitry as shown in FIG. 2. In a preferred embodiment, loop filter 26, VCO 28, loop filter 126, VCO 112, loop filter power splitter 32 and reference oscillator 12 can be provided as off-chip devices. Alternative implementations can be utilized without departing from the invention.

Loop 10 includes a reference oscillator 12, a differential amplifier 14, an integer divider 16, a phase frequency detector 18, a charge pump 20, a loop filter 26, a voltage controlled oscillator (VCO) 28, a power splitter 32, a differential amplifier 34, a fractional divider 36, and a circuit 50 for providing a fractional plus integer input to divider 36. Circuit 50 can include an integer register 56, fractional modulator 52, a fractional register 54, and an adder 58.

Charge pump 20 can be coupled to a reference current circuit 22 and a current setting circuit 24. Current setting circuit 24 can be controlled by register settings. Filter 26 is embodied as an active or passive RC filter to provide stability to the control loop and attenuate reference spurious signals. Phase frequency detector 18 is preferably embodied as a BiCMOS logic function providing an up/down control signal to charge pump 20.

Voltage controlled oscillator 28 is preferably an LC type oscillator having a control input coupled to loop filter 26 and an output coupled to power splitter 32. Power splitter 32 can be embodied as a Wilkenson power splitter. Voltage controlled oscillator 28 provides an output signal at output 29 at a first frequency f1 to amplifier 34 which operates as a buffer. Amplifier 34 can be configured to receive a differential signal. Although only shown as receiving a single signal in FIG. 2, the components of FIG. 2 are preferably configured to receive and provide differential signals. The output signal from voltage controlled oscillator 28 at frequency f1 is provided through amplifier 34 to fractional N1 divider 36.

Fractional N1 divider 36 is preferably embodied as a BiCMOS logic function configured as a frequency divider. Fractional N1 divider 36 preferably provides an output signal to an input of phase frequency detector 18 at a frequency of f1 divided by N1 where $(N0+(2i+1)/2-\Delta) < N1 < (N0+(2i+1)/2+\Delta)$, $i=[0, 1, 2 \ldots]$ and $0 < \Delta < 1/2$. The value of the fractional portion of number N1 is provided via fractional register 54 through fractional modulator 52. Fractional modulator 52 can be a 25 bit third order fractional modulator and can provided its value through summer 58. Summer 58 also receives an integer value from integer register 56. Integer register 56 can provide the value for N0+i. Accordingly, summer 58 of circuit 50 provides value N1 to divider 36.

An input of phase frequency detector 18 also receives a signal from integer divider 16. Reference oscillator 12 provides a reference oscillator signal at a frequency f0 to integer divider 16 through amplifier 14 which operates as a buffer amplifier. Integer divider 16 divides the output signal from reference oscillator 12 at frequency f0 by an integer R1 provided by 32 bit data register 60, to provide a signal at a frequency fr1 to phase frequency detector 18.

Phase frequency detector 18 compares the phase and frequency associated with the signal from divider 16 and the signal from divider 36 and provides a control signal to charge pump 20. Detector 18 can be embodied as a phase frequency detector. The output signal from charge pump 20 controls the oscillator 28, through loop filter 26 to adjust the frequency f1 of output signal at output 29 from oscillator 28. The frequency f1 of the output signal at output 29 is controlled so that the frequency of the signal from divider 36 is equal to the frequency of the signal from divider 16 in accordance with phase locked loop (PLL) operation. Preferably, frequency f1 is in the 2-8 GHZ range.

According to one embodiment, the output signal from voltage controlled oscillator 28 can have a variety of frequencies, preferably across a relatively continuous range. A preferred range of frequencies for the output signal from voltage controlled oscillator 28 is approximately 8 gigahertz (GHz). Preferably, a 32-bit data register provides values for the various components so that frequency f1 is constrained to value between adjacent harmonics of frequency fr1.

Loop 100 can be configured as a PLL and includes a differential amplifier 114, an integer divider 116, a phase frequency detector 118, a charge pump 120, a loop filter 126, a voltage controlled oscillator (VCO) 112, a current settings circuit 122, a reference setting circuit 124, and a CSR circuit 125. CSR circuit 125 performs cycle slip reduction to aid the control loop during frequency settling.

Charge pump 120 can be coupled to a reference current circuit 124 and a current setting circuit 122. Current setting circuit 122 can be controlled by register settings. Filter 126 can be embodied as an active or passive RC filter to provide stability to the control loop and attenuate reference spurious signals. Voltage control oscillator 112 is preferably an oscillator having a control input coupled to loop filter 126 and an output coupled to output 8 and amplifier 114, preferably configured as a buffer amplifier.

The output signal at output 8 is provided at a frequency f2 from oscillator 112 through amplifier 114 to integer divider 116. Integer divider 116 preferably receives an integer value from 32 data register 60 for dividing the frequency f2 of the signal at output 8 by an integer value N2. Divider 116 provides a signal at the frequency of f2/N2 to phase frequency detector 118.

Phase frequency detector 118 also receives a signal at a frequency of f1/R2 from integer divider 136. Integer divider 36 receives the signal at output 29 from splitter 32 through amplifier 134. Amplifier 134 is configured as a buffer amplifier. The signal at output 29 is provided at frequency f1. The integer value R2 is preferably provided by data register 60. Phase frequency detector 118 compares the phase and frequency associated with the signal from divider 116 and the signal from divider 136 and provides a control signal to charge pump 120 via filter 126.

Detector 118 is preferably embodied as a BiCMOS logic function providing an up/down control signal to charge pump 120. Divider 118 and 136 are preferably embodied as BiCMOS logic function configured as a frequency divider.

The output signal from charge pump 120 controls oscillator 112 to adjust the frequency f2 of the output signal at output 8. Preferably, a computing device, processor, or other circuitry provides values to data register 60 so that the frequency f2 is appropriately chosen in accordance with values for R1, R2, N1, and N2. Preferably, the values are chosen so that the output frequency f1 is constrained to a range of values between adjacent harmonics of the signal at frequency fr1 to reduce spurious sideband signals.

The frequency fr1 is 32 MHz in one preferred embodiment. Other values are possible, including, but not limited to, 16 MHz, 24 MHz, 64 MHz, etc.

Figure 3:
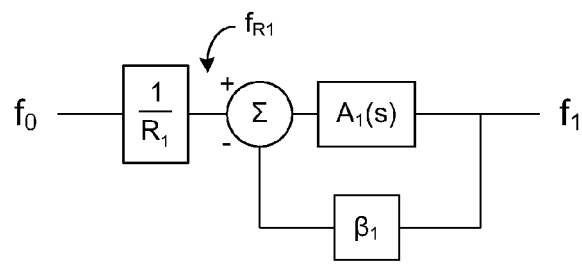
FIG. 3 is a drawing of the transfer function for a fractional N1 loop in the frequency synthesizer illustrated in FIG. 2 in accordance with a further exemplary embodiment.
Figure 5:
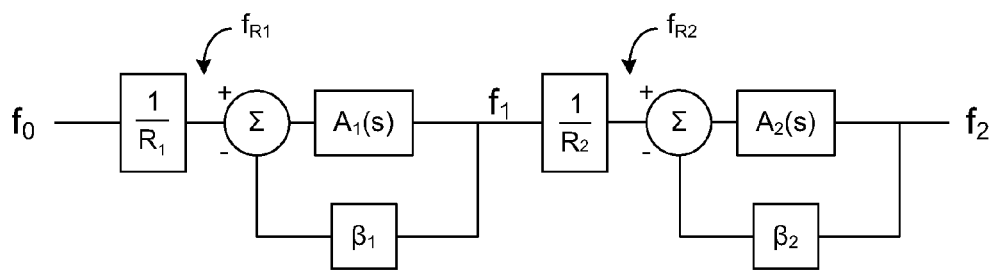
FIG. 5 is a drawing of a transfer function for the frequency synthesizer illustrated in FIG. 2 in accordance with still another exemplary embodiment.

With reference to FIGS. 2 and 3, the frequency f0 provided by oscillator 12 is preferably a fixed frequency signal from a stable frequency source such as a crystal oscillator. The signal fr1 from divider 16 is a divided version frequency signal f0. (fr1=f0/R1). In FIGS. 3 and 5, $$\beta_1 = \frac{1}{N_1}.$$

The frequency fr1 is a function of value of R1 which is a function of the maximum operating frequency of the phase detector used in loop 10. In accordance with phase locked loop (PLL) operation, f1=N1×fr1, where f1 is the frequency of the output signal of loop 10. Preferably, frequency f1 is constrained to a small range of frequencies located between adjacent harmonics of the reference frequency, fr1. In being constrained, f1 min=(N0+(2i+1)/2−Δ) fr1, and f1 max=(N0+(2i+1)/2+Δ)fr1.

Figure 4:
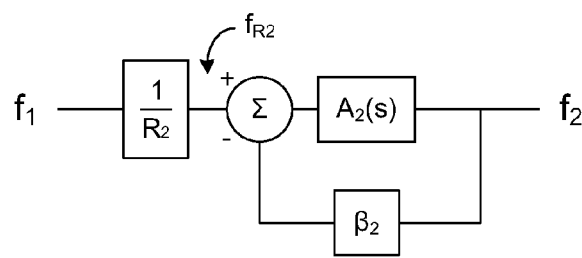
FIG. 4 is a drawing of a transfer function for an integer N2 loop in the frequency synthesizer illustrated in FIG. 2 in accordance with yet another an exemplary embodiment.

With reference to FIGS. 2 and 4, f2=N2 fr2 in accordance with one exemplary embodiment. In FIGS. 4 and 5, $$\beta_2 = \frac{1}{N_2}.$$

According to one embodiment, f2 min=f1min/R2max and fr2max=f1max/R2 min where R2 min and R2 max=a range of suitable values. R2 is chosen to realize a frequency suitable for detector 118. ΔR2=R2 max−R2 min. According to one embodiment, ΔR2=0 thereby providing a simplified synthesizer architecture.

According to another embodiment, f2 min=f1 min/R2 and fr2 max=f1 max/R2 wherein f1 min=(N0+(2i+1)/2−Δ)fr1 and f1 max=(N0+(2i+1)/2+Δ)fr1. Other mathematical expressions for exemplary embodiments of system 15 are given below:

$$f_{r2min} = \frac{f_{1min}}{R_2}$$

$$f_{r2max} = \frac{f_{1max}}{R_2}$$

$$f_{1min} = \left(N_0 + \frac{2i+1}{2} - \Delta\right)f_{r1}$$

$$f_{1max} = \left(N_0 + \frac{2i+1}{2} + \Delta\right)f_{r1}$$

$$f_{r2min} = \frac{N_0 + \frac{2i+1}{2} - \Delta}{R_2}f_{r1}$$

$$f_{r2max} = \frac{N_0 + \frac{2i+1}{2} + \Delta}{R_2}f_{r1}$$

Preferably, frequency characteristics for the output signal at frequency f2 is a range of frequencies between 2 and 8 gigahertz (GHz). R2 is chosen in loop 100 via N2 to realize the loop output frequency f2=N2×fr2. Since N2 is constrained to integer values, the output frequency signal at f2 (for loop 100) can be represented as shown in Table I below. N2 can be incremented as fr2 is varied from $f_{r2\ min}$ to $f_{r2\ max}$.

TABLE I

| k | $f_{r2min}$ | $f_{r2max}$ |
|---|---|---|
| k | $(N_{2min} + k)f_{r2min}$ | $(N_{2min} + k)f_{r2max}$ |
| 0 | $(N_{2min} + 0)f_{r2min}$ | $(N_{2min} + 0)f_{r2max}$ |
| 1 | $(N_{2min} + 1)f_{r2min}$ | $(N_{2min} + 1)f_{r2max}$ |
| 2 | $(N_{2min} + 2)f_{r2min}$ | $(N_{2min} + 2)f_{r2min}$ |

For continuous frequency coverage $$(N_{2min} + 0)f_{r2max} \geq (N_{2min} + 1)f_{r2min}$$

$$N_{2min}f_{r2max} - N_{2min}f_{r2min} \geq f_{r2min}$$

$$N_{2min}(f_{r2max} - f_{r2min}) \geq f_{r2min}$$

$$N_{2min} \geq \frac{f_{r2min}}{f_{r2max} - f_{r2min}}$$

Since $N_2$ must be an integer, $N_{2\ min}$ is the smallest integer value that is larger than the value given by:

$$N_{2min} = \frac{f_{r2min}}{f_{r2max} - f_{r2min}}$$

The minimum output frequency ($f_{2\ min}$) of loop 100 can be expressed as:

$$f_{2\ min} = N_{2\ min}f_{r2\ min}$$

where:

$$f_{r2min} = \frac{N_0 + \frac{2i+1}{2} - \Delta}{R_2}f_{r1}$$

$$f_{r2max} = \frac{N_0 + \frac{2i+1}{2} + \Delta}{R_2}f_{r1}$$

While the detailed drawings, specific examples and particular formulations given describe preferred and exemplary embodiments, they serve the purpose of illustration only. The inventions disclosed are not limited to the specific forms shown. For example, the methods may be performed in any of a variety of sequence of steps. The hardware and software configurations shown and described may differ depending on the chosen performance characteristics and physical characteristics. The mathematical formulas can be altered according to application criteria. For example, the type of device, communications bus, or processor used may differ. The term coupled to refers to direct and indirect coupling so that signals or forms of signals can be communicated between devices. The systems and methods depicted and described are not limited to the precise details, values and conditions disclosed. Furthermore, other substitutions, modifications, changes, and omissions may be made in the design, operating conditions, and arrangement of the exemplary embodiments without departing from the scope of the invention as expressed in the appended claims.

What is claimed is:

1. A frequency synthesizer for providing a first output signal in the 2-8 GHz range, the frequency synthesizer comprising:
a fractional loop having a first output for providing a second output signal, the fractional loop including a fractional divider, the fractional divider having a fractional divider input coupled to the first output and a fractional divider output coupled to a first input of a first detector, a second input of the first detector being coupled to a reference signal, wherein the reference signal has a reference frequency less than 40 MHz, wherein an output of the first detector provides a first control signal to a first oscillator, the first oscillator providing the second output signal; and
an integer loop having a first input coupled to receive the second output signal and a second output for providing the first output signal, the integer loop including a first integer divider, the first integer divider having a first integer divider input coupled to the first input of the integer loop and a first integer divider output coupled to a first input of a second detector, a second input of the second detector being coupled to receive a second integer divider output signal of a second integer divider, a second integer divider input of the second integer divider being coupled to receive the first output signal, wherein an output of the second detector provides a second control signal to a second oscillator, the second oscillator providing the first output signal.

2. The frequency synthesizer of claim 1 wherein the fractional loop includes an integer plus fraction circuit.

3. A frequency synthesizer for providing a first output signal in the 2-8 GHz range, the frequency synthesizer comprising:
a fractional loop having a first output for providing a second output signal, the fractional loop including a fractional divider, the fractional divider having a fractional divider input coupled to the first output and a fractional divider output coupled to a first input of a first detector, a second input of the first detector being coupled to a reference signal, wherein the reference signal has a frequency is less than 40 MHz;
an integer loop having a first input coupled to receive the second output signal and a second output for providing the first output signal, the integer loop including a first integer divider, the integer divider having a first integer divider input coupled to the first input and a first integer divider output coupled to a first input of a second detector, a second input of the second detector being coupled to receive a second integer divider output of a second integer divider, a second integer divider input of the second integer divider being coupled to receive the first output signal, wherein the fractional loop includes an integer plus fraction circuit; and
wherein the integer plus fraction circuit includes a third order fractional modulator.

4. The frequency synthesizer of claim 3 wherein the integer plus fraction circuit includes an integer register, a fractional register and a summer.

5. The frequency synthesizer of claim 4 wherein the fractional loop includes a fractional RF divider coupled to the summer.

6. The frequency synthesizer of claim 1 wherein the frequency of the second output signal is constrained to a range of frequencies located between adjacent harmonics of the reference frequency.

7. The frequency synthesizer of claim 5 wherein the reference frequency is provided by a second integer divider.

8. The frequency synthesizer of claim 6 wherein the second integer divider is coupled to a fixed frequency oscillator.

9. The frequency synthesizer of claim 8 wherein the fixed frequency oscillator is a crystal oscillator.

10. The frequency synthesizer of claim 1 wherein the integer loop further comprises a voltage controlled oscillator having a VCO output for providing the first output signal and a VCO control input coupled to an output of the second detector.

11. An electronic device, comprising:
a frequency synthesizer having a fractional loop and an integer loop, wherein a frequency of an output signal of the fractional loop is constrained to a range of values between adjacent harmonics of a reference frequency used in the fractional loop and wherein the output signal is received by the integer loop, wherein the fractional loop includes a first oscillator and the integer loop includes a second oscillator, the first oscillator providing the output signal of the fractional loop and the second oscillator provides an output signal of the integer loop, wherein the fractional loop includes an integer plus fraction circuit including a third order fraction modulator, an integer register, a fractional register and a summer.

12. The electronic device of claim 11, wherein the fractional loop comprises a fractional divider, the fractional divider having a fractional divider input coupled to receive the output signal and a fractional divider output coupled to a first input of a first detector, a second input of the first detector being coupled to receive a reference signal.

13. The electronic device of claim 12 wherein the integer loop comprises a first integer divider including a first input coupled to receive the output signal and a second output coupled to a first input of a second detector, a second input of the second detector being coupled to receive a divided output signal of the integer loop.

14. An electronic device, comprising:
a frequency synthesizer having a fractional $N_1$ loop and an integer loop, wherein a frequency of an output signal of the fractional loop is constrained to a range of values between adjacent harmonics of a reference frequency used in the fractional loop and wherein the output signal is received by the integer loop, wherein the fractional $N_1$ loop includes an integer plus fraction circuit including a third order fractional modulator, an integer register, a fractional register and a summer.

15. An electronic device, comprising:
a frequency synthesizer having a fractional $N_1$ loop and an integer loop, wherein a frequency of an output signal of the fractional $N_1$ loop is constrained to a range of values between adjacent harmonics of a reference frequency used in the fractional $N_1$ loop and wherein the output signal is received by the integer loop, wherein a frequency of the output signal is a function of the reference signal, where $N_1$ is defined by $(N_0+(2i+1)/2-\Delta)<N_1<(N_0+(2i+1)/2+\alpha)$, where $N_0$ is a minimum realizable integer value for a center frequency of the output signal, i is an integer, and $\Delta$ is a number less than or equal to 0.5.

16. An electronic device, comprising:
a frequency synthesizer having a fractional $N_1$ loop and an integer loop, wherein a frequency of an output signal of the fractional loop is constrained to a range of values between adjacent harmonics of a reference frequency used in the fractional loop and wherein the output signal is received by the integer loop, wherein the frequency of the output signal is a function of the reference signal, where $N_1$ is defined by $((N_0+(2i+1)/2-\Delta)<N_1<((N_0+(2i+1)/2-\Delta), \ldots, (N0+(2j+1)/2-\Delta))<N_1<(N0+(2j+1)/2+\Delta))$, where $N_0$ is a minimum realizable integer value for a center frequency of the output signal, i is an integer, j is an integer greater than i, and $\Delta$ is a number less than to 0.5.

17. The electronic device of claim 15 wherein the frequency of a second output signal is constrained by choosing appropriate values for $N_0$, i and $\Delta$.

18. A method of providing an output signal, the method comprising:
   providing a first signal from a first oscillator at a first frequency to a fractional divider in a first loop;
   providing a first divided signal from the fractional divider to a phase detector, wherein the fractional divider uses an integer plus fraction circuit for a fractional $N_1$ loop, the integer plus fraction circuit including an integer register, a third order fractional modulator, a fractional register and a summer;
   providing a reference frequency signal to the detector;
   providing a control signal from the detector to the first oscillator, wherein a frequency of the first signal is chosen to be in a range between adjacent harmonics of the reference frequency; and
   providing the first signal to an integer divider phase locked loop, the integer divider phase locked loop including a second oscillator for providing the output signal.

19. The method of claim 18 wherein the frequency is above 1 GHz.

20. The method of claim 19 wherein the range is 32 MHz.

* * * * *